United States Patent [19]  [11]  4,353,788
Jeffrey et al.  [45]  Oct. 12, 1982

[54] RF SPUTTERING FOR PREPARING SUBSTANTIALLY PURE AMORPHOUS SILICON MONOHYDRIDE

[75] Inventors: Frank R. Jeffrey; Howard R. Shanks, both of Ames, Iowa

[73] Assignee: The United States of America as represented by the United States Department of Energy, Washington, D.C.

[21] Appl. No.: 181,410

[22] Filed: Aug. 26, 1980

[51] Int. Cl.³ .............................................. C23C 15/00
[52] U.S. Cl. ................................. 204/192 S; 423/347
[58] Field of Search ............ 136/258 AM; 204/192 S, 204/192 P; 423/347

[56] References Cited

U.S. PATENT DOCUMENTS 4,252,865  2/1981  Gilbert et al. ............... 204/192 S X

OTHER PUBLICATIONS

Brodsky, "Thin Solid Films", 50, (1978), pp. 57–67.
Thompson et al., "Proced. Int'l Photovoltaic Solar Energy Conf.", 8/78, pp. 231–240.
Anderson et al., "J. Vac. Sci. Technol.", 16(3), 6/79, pp. 906–912.
Jeffrey et al., "J. Appl. Phys.", 50(11), 11/79, pp. 7034–7038.
Jeffrey et al., "8th International Conf. on Amorphous Liquid Semicond.", 8/27/79.
Stein et al., "Applied Physics Letters", 34(9), 1979, p. 604.

*Primary Examiner*—Jack Cooper
*Attorney, Agent, or Firm*—James W. Weinberger; Walter L. Rees; Richard G. Besha

[57] ABSTRACT

A process for controlling the dihydride and monohydride bond densities in hydrogenated amorphous silicon produced by reactive rf sputtering of an amorphous silicon target. There is provided a chamber with an amorphous silicon target and a substrate therein with the substrate and the target positioned such that when rf power is applied to the target the substrate is in contact with the sputtering plasma produced thereby. Hydrogen and argon are fed to the chamber and the pressure is reduced in the chamber to a value sufficient to maintain a sputtering plasma therein, and then rf power is applied to the silicon target to provide a power density in the range of from about 7 watts per square inch to about 22 watts per square inch to sputter an amorphous silicon hydride onto the substrate, the dihydride bond density decreasing with an increase in the rf power density. Substantially pure monohydride films may be produced.

6 Claims, 7 Drawing Figures

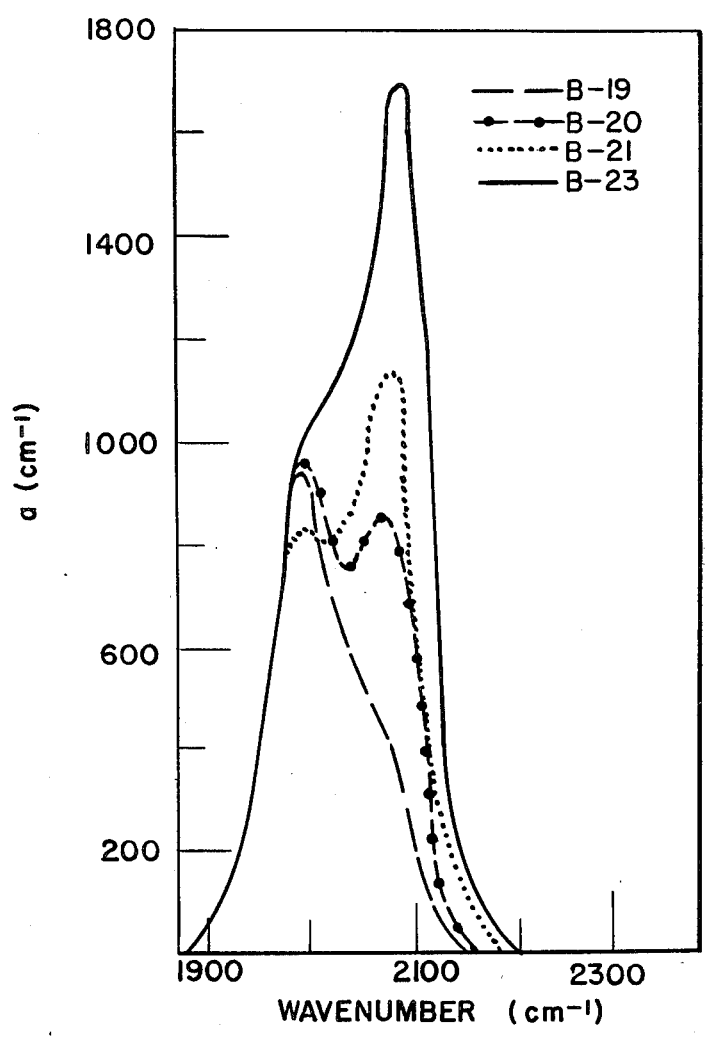

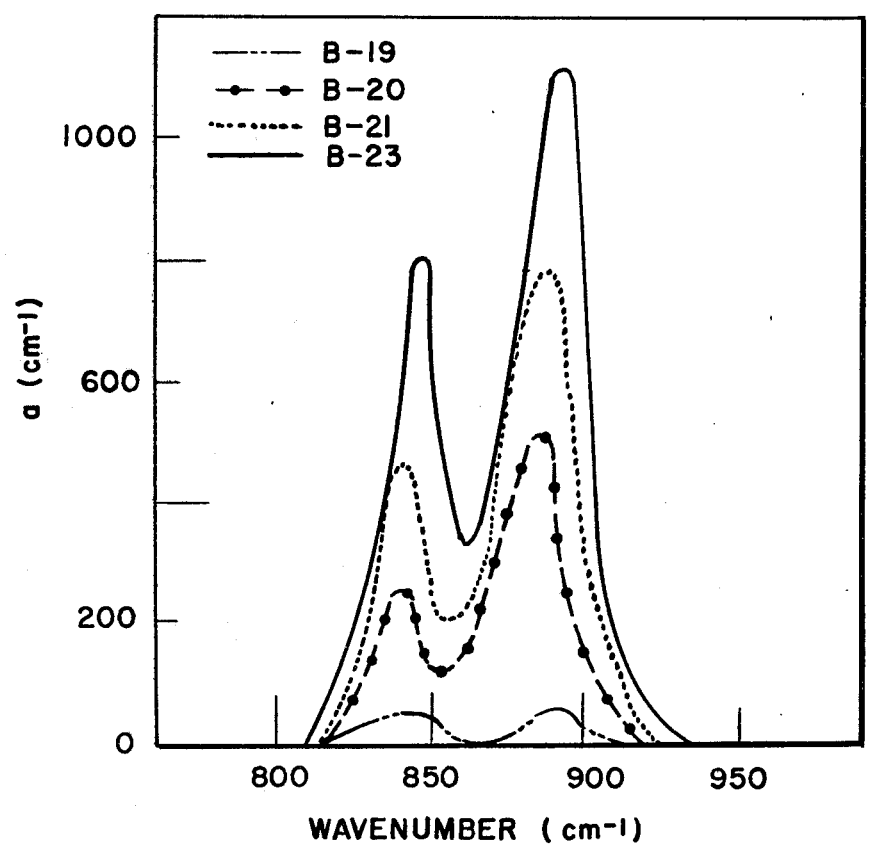

RF SPUTTERING FOR PREPARING SUBSTANTIALLY PURE AMORPHOUS SILICON MONOHYDRIDE

CONTRACTUAL ORIGIN OF THE INVENTION

The invention described herein was made in the course of, or under, a contract with the UNITED STATES DEPARTMENT OF ENERGY.

BACKGROUND OF THE INVENTION

This invention relates to a process for controlling the dihydride and monohydride bond densities in amorphous silicon hydrides produced by reactive rf sputtering of an amorphous silicon target.

Monohydride bonding is the configuration where only one of the four tetrahedral bonding sites of a silicon atom is bonded to a hydrogen atom. Dihydride bonding has two of the sites filled by hydrogen atoms. The interest in producing exclusively monohydride bonding or substantially pure silicon monohydride comes from the reported conductivity and better semiconductor properties of substantially pure silicon monohydride films.

Amorphous films combining silicon and hydrogen in various concentrations and bonding configurations have been produced by both glow-discharge deposition from silane and by reactive rf sputtering in a hydrogen-argon atmosphere. The glow-discharge process results in a combination of dihydride and monohydride bonding configurations, if deposited on a substrate maintained at a temperature below 200° C., but exclusive monohydride bonding is obtained if the substrate is held at a temperature above 200° C. The glow-discharge method has produced variations in the type of bonding in the amorphous film but has been limited in the range of hydrogen density it can produce.

Reactive sputtering has produced uncontrolled combinations of monohydride and dihydride bonding, but can be used to produce films of varying hydrogen density, principally through variation of the argon to hydrogen ratio; however, reactive sputtering has not been capable of producing films with an exclusive monohydride bond or of producing films in which the ratio of monohydride to dihydride bonding can be preselected.

M. H. Brodsky in a paper entitled "PLASMA PREPARATIONS OF AMORPHOUS SILICON FILMS" published in 1978 in Thin Solid Films, Volume 50, pages 57–67, principally sets out and reviews the two plasma methods for the preparation of hydrogenated amorphous silicon films, these two methods being the above-referenced silane glow discharge decomposition and the argon-hydrogen reactive sputtering. As stated by Brodsky in his paper, a reactive sputtering method for independently controlling the bonding sites, that is the ratio of monohydride and dihydride bonding, has not yet been reported.

SUMMARY OF THE INVENTION

Therefore, it is a principal object of the present invention to provide a process for controlling the ratio of dihydride to monohydride bonding in amorphous silicon hydride, produced by reactive rf sputtering.

It is another object of the present invention to provide a process for controlling the dihydride and monohydride bond densities in hydrogenated amorphous silicone produced by reactive rf sputtering of an amorphous silicon target, comprising providing a chamber with an silicon target and a substrate therein, positioning the substrate and the target such that when rf power is supplied to the target the substrate is in contact with the sputtering plasma produced thereby, providing hydrogen and argon to the chamber, reducing the pressure in the chamber to a value sufficient to maintain a sputtering plasma therein and applying rf power to the silicon target to provide a power density in the range of from about 7 watts per square inch to about 22 watts per square inch to sputter an amorphous silicone hydride onto the substrate, the dihydride bond density decreasing with an increase in the rf power density.

Still another object of the present invention is to provide a process for producing substantially pure amorphous silicone monohydride by reactive rf sputtering of an silicon target, comprising providing a chamber with an amorphous silicon target and a substrate therein, positioning the substrate and the target such that when rf power is applied to the target the substrate is in contact with the sputtering plasma produced thereby, providing hydrogen and argon to the chamber, reducing the pressure in the chamber to a value sufficient to maintain a sputtering plasma therein, and applying rf power to the silicon target to provide a power density of not less than about 15 watts per square inch to sputter substantially pure amorphous silicon monohydride onto the substrate.

These and other objects of the present invention will be more readily understood by reference to the accompanying specification taken in conjunction with the drawings in which:

DESCRIPTION OF THE FIGURES

FIG. 5 is a graph illustrating the relationship of the absorption coefficient and the wave number for four samples, particularly illustrating the decrease in the dyhydride peak as a function of the increase in rf sputtering power;

FIG. 6 is a graph illustrating the relationship between absorption coefficients and wave number for the same four samples illustrated in FIG. 5.

DETAILED DESCRIPTION OF THE INVENTION

Figure 1:
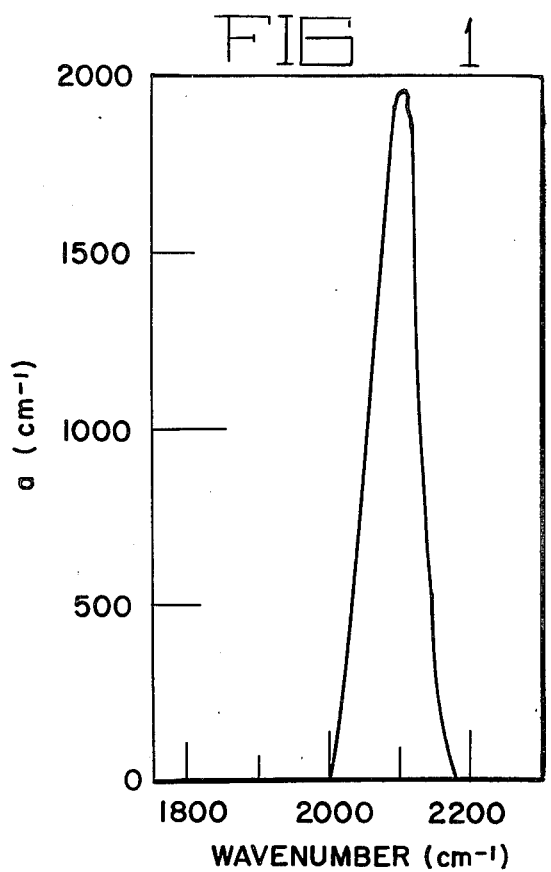
FIG. 1 is a graph illustrating the stretching mode absorption peak for a sample film prepared with a substrate-target separation of eight centimeters wherein the substrate temperature was 300° C. and the rf power was 250 watts.

The films discussed hereinafter were fabricated in a relatively standard rf sputtering system in which there was a chamber connected by means of a right angle valve to a roots pump and a fore pump. The chamber was also connected through a butterfly valve to a liquid nitrogen cold trapped diffusion pump. These pumps cooperate to provide reduced pressure in the chamber of about $10^{-6}$ Torr for cleaning the system to a pressure of about $10^{-2}$ Torr during the actual rf sputtering. In all cases the silicon target was a 6 inch cast silicon, circular in shape with an area of 28.26 square inches and having an impurity level of less than about $10^{17}$ cm$^{-3}$. Although the rf power reported herein is in terms of watts, it will be understood that by dividing the watts by the target area a power density figure is determined, whereby 600 watts is about 21.2 watts per square inch and it is the power density rather than the pure power in watts which is the critical factor.

The standard device used in producing the films reported herein included a movable J-shaped electrically grounded pedestal which was water cooled and fitted with a resistive heater capable of heating the substrate to 350° C. As is well known in the art, a rotatable shutter was positioned between the target and the substrate to allow sputter cleaning of both the target and the substrate before deposition was initiated. At higher power, sputtering plasma could not be maintained with the shutter open whereby the shutter itself was used as the substrate holder.

An rf generator operating at 13.56 MHz supplied the power to the silicon target during sputtering and to the pedestal during sputter etch precleaning of the substrates. The generator was capable of delivering up to 600 watts which created a maximum dc sputter voltage of 2 kV.

The argon and hydrogen flow rates were controlled through independent leak valves and mass flow meters. The two gases were combined in a mixture tank and fed from there into the system. During operation, the system was pumped by a roots-type pump backed by a mechanical fore pump. Chamber pressure was varied by changing the input flow rates and during the examples hereinafter reported the argon flow rate was maintained at 60 cubic cm per minute at STP and the hydrogen flow rate was maintained at about 7.5 cubic cm per minute at STP. Chamber pressure for the above flow rates was generally maintained at about $5 \times 10^{-2}$ Torr and prior to each deposition the chamber was flushed with argon and pumped down to $10^{-6}$ Torr by a separate liquid-nitrogen cold-trap diffusion pump-forepump system.

During rf sputtering chamber pressure was maintained in the range of from about 2 to about $3 \times 10^{-2}$ Torr. The hydrogen partial pressure has a well known effect on the obtainable hydrogen densities in reactive rf sputtering and generally the hydrogen partial pressure was maintained within the range of from about $10^{-3}$ Torr to $^{-2}$ Torr, with the preferred pressure being about $3 \times 10^{-3}$ Torr, greater hydrogen partial pressures tending to short out the sputtering plasma. Rf power was varied within the range of from about 200 watts (about 7 watts per square inch) to about 600 watts (about 22 watts per square inch) while substrate temperature was determined to have no substantial effect on the hydride densities. In general, high power densities are preferred because they produce higher sputtering rates (hence higher deposition rates), an important commercial consideration.

As is well known, substrates useful for IR optical measurements were single crystal silicon slices polished on both sides. The transmission coefficient and the reason of interest for these substrates was 0.5 and transmission data was obtained on a beckman 425 dual-beam spectrophotometer.

Referring now to FIG. 1, there is shown the stretching mode absorption peak for a thin film prepared wherein the substrate and the target were separated by a distance of about 8 centimeters such that the substrate was outside of the glowing region of the plasma and did not contact same. The substrate was held at a temperature of 300° C. during the deposition, and the rf power was in the order of 250 watts or a power density of about 8.84 watts per square inch. The dominance of the dihydride absorption peak at 2090 cm$^{-1}$ shows the importance of the geometric relationship between the substrate and the sputtering plasma produced by the target when the rf power is applied thereto. In addition, the data show that heating the substrate has no discernable effect on the dihydride bond density.

Figure 2:
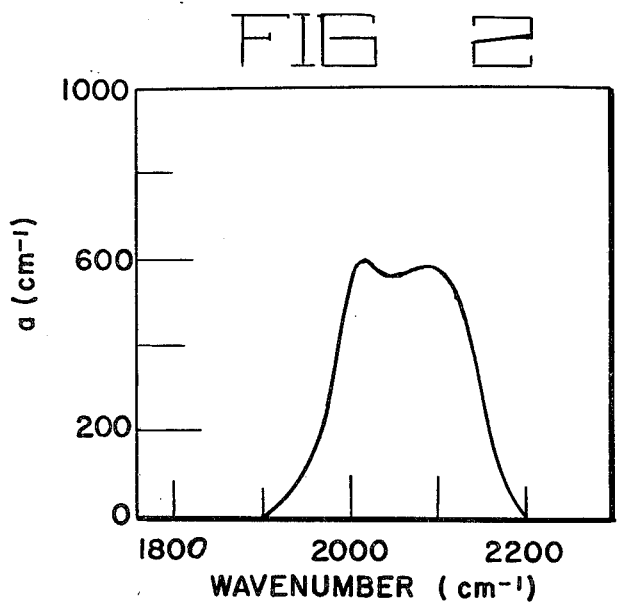
FIG. 2 is a graph illustrating the stretching mode absorption peak for a sample film prepared with a substrate-target separation of 1.5 centimeters wherein the substrate was unheated and the rf power was 270 watts.

FIG. 2 shows the stretching mode absorption peak for a film deposited on a substrate which was positioned within 1.5 cm of the target and well within contact of the sputtering plasma produced thereby, and wherein the rf power was 270 watts or 9.55 watts per square inch, the substrate being unheated. Comparing FIGS. 1 and 2 shows the importance of the target-substrate geometry and particularly the importance of positioning the substrate in contact with the sputtering plasma produced by the target. The data show a significant decrease in the dihydride absorption peak and a clear indication of the monohydride absorption peak at 2000 cm$^{-1}$.

Table I set forth below presents a summary of sputtering parameters and rf absorption data. The first six columns give the sputtering parameters that were varied between the samples which are denoted in the first column by sample numbers. The next two columns give the densities of the monohydride and dihydride bond as determined from IR absorption due to the stretching modes thereof, and the last column presents the dihydride density as determined from the bending mode absorption. The two dots in the last row indicate that meaningful measurements were not obtainable. FIGS. 3 through 6 present graphical interpretations of the data set forth in Table I.

TABLE I

| Sample # | r.f. Power (watts) | Sputt. Rate (A/min) | DC Target Voltage (kv) | Substrate Temp. (°C.) | Ion Temp. in Plasma | | Si—H Density ($10^{22}$cm$^{-3}$) | Si—H$_2$ Density (Stretching) ($10^{22}$cm$^{-3}$) | Si—H$_2$ Density (Bending) ($10^{22}$cm$^{-3}$) |
|---|---|---|---|---|---|---|---|---|---|
| | | | | | Upper Limit (K) | Lower Limit (K) | | | |
| B-23 | 200 | 192 | 1.00 | 92 | 541 | 394 | 0.58 | 1.00 | 1.00 |
| B-21 | 300 | 319 | 1.25 | 122 | 594 | 427 | 0.53 | 0.60 | 0.62 |
| B-20 | 370 | 416 | 1.50 | 153 | 631 | 457 | 0.69 | 0.38 | 0.40 |
| B-19 | 430 | 500 | 1.75 | 192 | 655 | 475 | 0.63 | 0.15 | 0.06 |
| B-39 | 580 | 620 | 2.00 | 210 | 705 | — | 0.87 | — | <0.01 |

Figure 3:
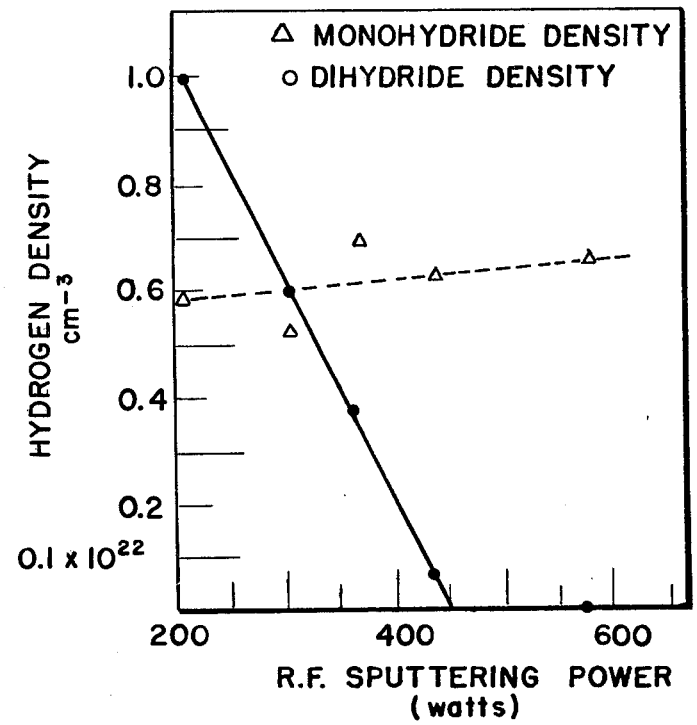
FIG. 3 is a graph showing the monohydride and dihydride densities in series of films as a function of the rf power used in depositing the film.

FIG. 3 shows the relationship between the hydrogen density and the rf sputtering power in watts for both the monohydride and the dihydride with an increase in the rf sputtering power to about 450 watts resulting in an undetectable amount of the dihydride configuration. Accordingly, it is clearly seen that the ratio between the monohydride density and the dihydride density can be varied or controlled by varying or controlling the rf sputtering power, other parameters in the system remaining constant. This provides a method for preselecting a desired monohydride to dihydride ratio and selecting the required rf sputtering power (or power density) to effect the preselected ratio. Clearly substantially pure monohydride films may be deposited by employing power densities in excess of about 15 watts per inch square.

Figure 4:
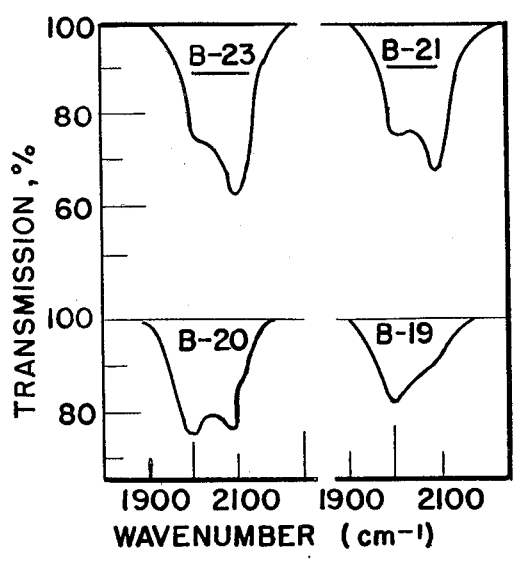
FIG. 4 is a graph showing the relationship of the transmittance and the wave number for four samples prepared at different rf powers, illustrating peaks for both the monohydride bonds and the dihydride bonds.

Referring to FIG. 4 of the drawings there is illustrated IR transmittance data for four samples (see Table I) deposited at different rf power settings. These four samples were prepared wherein the substrates were held 1 cm above an electrically grounded shutter by insulating disks such that the substrate surfaces were 0.5 cm below the edge of the sputtering "dark space" (1.5 cm below the target). Although these samples were electrically isolated during deposition, other samples which were grounded during deposition show the same monohydride to dihydride ratio, whereby the characteristics of the film are not significantly dependent upon the self-bias voltage of the sample. Although the substrates were not heated independently of the sputtering process, there was a measureable temperature rise during sputtering, also not of appreciable significance.

The transmittances have been corrected for the shallow interference fringes due to the differences in the index of refraction of the single crystal substrate and the amorphous film. The region of the IR spectrum shown contains the absorption bands for the stretching mode of the silicon-hydrogen bonds. It is known from the work of Brodsky previously referred to that amorphous silicone monohydride has an absorption peak of 2000 $cm^{-1}$ and that amorphous silicone dihydride has a peak of 2090 $cm^{-1}$, and as seen in FIG. 4, the dihydride bonding is reduced from the predominant configuration to a minor configuration as the rf sputtering power, and hence the power density, is increased from 200 watts (7.09 watts per square inch) to 430 watts (15.2 watts per square inch).

The transmittance data of FIG. 4 were converted into absorption coefficients by the method described by Brodsky et al. and are illustrated in FIG. 5. By using the superposition of two Gaussian distributors, one centered at 2000 $cm^{-1}$ and one centered at 2090 $cm^{-1}$, the absorption coefficients for the monohydride bonds and the dihydride bonds can be isolated. Brodsky's technique can then be used to calculate the density of monohydride and dihydride bonds in each amorphous silicon hydride film. In doing this, the local field correction to the effective charge of silicon monohydride in amorphous silicon was determined by correlating absorption data versus nuclear resonance date. Absorption coefficients for the bending modes of the dihydride configuration were also determined and are shown in FIG. 6. Dihydride bond densities were calculated from those modes and compared to the results from the stretching modes. The numbers compare well except for the lowest dihydride density sample. The stretching mode calculation is expected to be inaccurate for this sample because of the difficulty in determining the contribution of the 2090-$cm^{-1}$ mode to the overall absorption peak.

Figure 7:
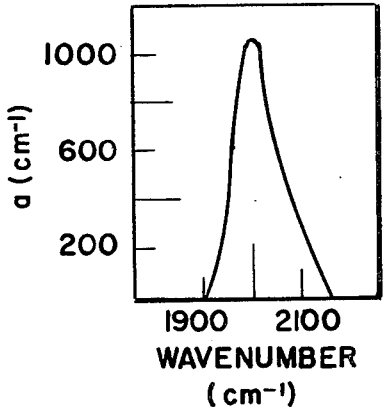
FIG. 7 is a graph illustrating the relationship of the absorption coefficients and wave number for a sample wherein the rf sputtering power was sufficient to reduce the dihydride bond density to an undetectable level.

In order to raise the rf power above 340 watts without modifying the characteristics of the plasma, the chamber pressure was reduced. Sample B39 was produced under the same geometrical configuration as the previous samples but at a pressure of $3 \times 10^{-2}$ Torr. Argon and hydrogen flows during deposition of this sample were 29 and 18 $cm^3/min$, respectively. FIG. 7 shows the absorption peak for the silicon mono hydride stretching modes. This peak is not symmetrical about 2000 $cm^{-1}$, but it is unclear whether this is due to dihydride bonds giving a component at 2100 $cm^{-1}$ or some sort of monohydride-monohydride interaction. It was not possible to estimate a dihydride content from this peak. No discernable absorption occured at the 840 and 890 $cm^{-1}$ bending mode frequencies. Thus the dihydride content is below the detection limit of these absorption modes which is approximately $0.01 \times 10^{22}$ $cm^{-3}$ or 0.2 at .%.

Although the rf power was the independently varied sputtering parameter, a number of other sputtering parameters change with it. These include sputter rate, sputter voltage, and ion temperature in the plasma. Substrate surface temperature will also vary as a secondary function of sputter rate and ion temperature. Substrate temperatures were measured by thermocouple during trial depositions. The rf sputtering power and sputter voltage were read directly from the system. Sputter rates were calculated from thickness measurements. The temperature of the ions and neutral atoms in the plasma is not easily measured. However, an upper bound was calculated by assuming that all rf power is absorbed in the area between the target and shutter and also assuming that all energy loss from the region is through radiation obeying the Stefan-Boltzmann law. A lower limit for the ion temperature was measured by a thermocouple suspended in the plasma region.

In analyzing the data it is believed that the most important criteria is the combination of the geometric relation between the target and substrate such that the substrate is contacted by the sputtering plasma produced by the target when rf power is applied thereto and the adjustment of the power density to the system thereby causing a significant decrease in the dihydride bond density while the monohydride bond density very slightly increases, see FIG. 3. The dihydride to monohydride density ratios can be varied from a condition wherein the dihydride is the dominant configuration to a condition in which the monohydride is the dominant configuration. Accordingly, it is seen that the inventive process may be used to produce a substantially pure amorphous silicon monohydride by reactive rf sputtering.

While there has been disclosed a process for controlling the dihydride and monohydride bond densities in hydrogenated amorphous silicon and a process for producing substantially pure amorphous silicon monohydride by reactive rf sputtering, it will be obvious to those skilled in the art that various modifications and alterations may be made therein without departing from the spirit and scope of the present invention, and it is intended to cover in the claims appended hereto all such alterations and modifications.

The embodiments of the invention in which an exclusive property or privilege is claimed are defined as follows:

1. A process for producing substantially pure amorphous silicon monohydride by reactive rf sputtering of a silicon target, comprising providing a chamber with an amorphous silicon target and a substrate therein, positioning said substrate and said target such that the adjacent edges of the substrate and the target are within about 2 cm, providing a partial pressure of hydrogen of at least $10^{-3}$ torr to said chamber, providing argon to said chamber, reducing the pressure in said chamber to a value sufficient to maintain a sputtering plasma therein, and applying rf power to the silicon target to provide a power density of not less than about 15 watts per square inch to sputter substantially pure amorphous silicon monohydride onto said substrate while maintaining said partial pressure of hydrogen.

2. The process of claim 1, wherein the adjacent edges of said substrate and said target are within 1.5 cm.

3. The process of claim 1, wherein the partial pressure of hydrogen in said chamber is maintained within the range of from about $10^{-2}$ Torr to about $10^{-3}$ Torr.

4. The process of claim 1, wherein the pressure in said chamber during sputtering is not less than about $2 \times 10^{-2}$ Torr.

5. The process of claim 1, wherein the pressure within said chamber during sputtering is maintained within the range of from about $2 \times 10^{-2}$ Torr to about $6 \times 10^{-2}$ Torr.

6. The process of claim 1, wherein said power density provided to said silicon target is in the range of from about 15 watts per square inch to about 20 watts per square inch.